United States Patent [19]
Costello et al.

[11] Patent Number: 6,104,203
[45] Date of Patent: *Aug. 15, 2000

[54] TEST APPARATUS FOR ELECTRONIC COMPONENTS

[75] Inventors: Simon Costello, Venice; Louis Ryan; Paul Pham, both of Burbank; Mircea Motora, Downey, all of Calif.

[73] Assignee: Trio-Tech International, San Fernando, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/648,614

[22] Filed: May 16, 1996

[30] Foreign Application Priority Data

May 16, 1995 [IE] Ireland .................................. S950353

[51] Int. Cl.[7] ........................................................ G01R 1/02
[52] U.S. Cl. .......................................... 324/760; 165/11.1
[58] Field of Search .................................... 324/755, 760; 165/11.1, 11.2, 200, 201; 219/209, 464, 536

[56] References Cited

U.S. PATENT DOCUMENTS

| | | | |
|---|---|---|---|
| 4,491,173 | 1/1985 | Demand ..................................... | 165/11 |
| 4,791,364 | 12/1988 | Kufis et al. .............................. | 324/158 |
| 4,870,355 | 9/1989 | Kufis et al. .............................. | 324/158 |
| 5,001,423 | 3/1991 | Abrami et al. .......................... | 324/158 |
| 5,084,671 | 1/1992 | Miyata et al. ........................... | 324/760 |
| 5,315,240 | 5/1994 | Jones ....................................... | 324/760 |
| 5,420,521 | 5/1995 | Jones ....................................... | 324/760 |

FOREIGN PATENT DOCUMENTS

| | | |
|---|---|---|
| 0069592 | 1/1983 | European Pat. Off. . |
| 0131375 | 1/1985 | European Pat. Off. . |
| 0255247 | 2/1988 | European Pat. Off. . |
| 0675366 | 10/1995 | European Pat. Off. . |

*Primary Examiner*—Glenn W. Brown
*Attorney, Agent, or Firm*—Jacobson, Price, Holman & Stern, PLLC

[57] ABSTRACT

A test apparatus (1) has a temperature controlled chuck (8) which provides good mechanical stability across a wide temperature range. This significantly reduces the number of times the probes (9) must be re-positioned, and in some cases eliminates such re-positioning. The chuck (8) has a support plate (20) which is connected to a base plate (35) by pillars (40) which have a low thermal expansion coefficient. This limits thermal expansion between the support plate (20) and the base plate (35). In addition, the heat transfer means is mounted so that thermal expansion is accommodated internally.

25 Claims, 5 Drawing Sheets

TEST APPARATUS FOR ELECTRONIC COMPONENTS

INTRODUCTION

1. Field of the Invention

The invention relates to a test apparatus of the type comprising a temperature controlled chuck which supports the electronic device (such as a semiconductor wafer) under test and directly heats and/or cools the device by conduction. The heating and/or cooling is caused by a heat transfer means which is mounted underneath the support plate. Typically, the temperature ranges for testing in such apparatus are in the region of −135° C. to +400° C., or subsets within this range.

2. Prior Art Discussion

Such test apparatus are described in various publications including EP 131,375 (Texas Instruments), EP 675,366 (Tokyo Electron Limited), U.S. Pat. No. 4,870,355 (Thermonics Inc.), U.S. Pat. No. 4,491,173 (Temptronic Corporation), and EP 69,592 (Fujitsu). In operation of such apparatus, various probes are placed precisely on the device under test, and microscopes may also be used. Spacing between test positions on the device under test are often less than 1 micron. Accordingly, excellent accuracy is required and, further, mechanical stability of the chuck over the temperature range is very important. Where there is a wide temperature range during testing, the chuck tends to expand and contract by virtue of thermal expansion and contraction, thus necessitating adjustment of the microscopes and probes. This involves, for example, lifting the probes and then re-setting the device under test. This is a time-consuming exercise which can in some instances lead to inaccuracies and at the very least causes a greater amount of handling of the device under test than is desired.

OBJECTS OF THE INVENTION

It is an object of the invention to provide a test apparatus which provides greater mechanical stability in the chuck to minimise or eliminate the need for re-positioning of probes and microscopes.

A further object is to provide a greater level of electrical isolation of the device under test than has heretofore been the case.

Another object of the invention is to provide a test apparatus having a chuck which is of simple construction resulting in lower cost production, greater reliability and easier maintenance.

SUMMARY OF THE INVENTION

The invention provides a temperature controlled chuck for a test apparatus for testing electronic devices, the chuck comprising:

a support plate having a device-contacting upper surface;
a base plate mounted below the support plate;
means for connecting the base plate to a test apparatus;
a connector having a low thermal expansion coefficient interconnecting the base plate and the support plate to provide a rigid structure of the support plate, the connector, and the base plate,
a heat transfer means mounted between the support plate and the base plate;
mounting means for the heat transfer means comprising means for accommodating expansion of the heat transfer means internally within the rigid structure.

By providing the rigid structure as described, low thermal expansion between the base and support plates, and the mounting means described, there is both little overall thermal expansion of the structure and little or no distortion of the structure caused by the heat transfer means. The chuck is therefore thermally stable and the absolute position of the device under test changes very little. This is a very simple way of solving a problem which has proved to cause many difficulties in practice. Various materials may be used for the connector to achieve a low thermal expansion. Invar™ is one material which has been found to be particularly suitable. The coefficient of thermal expansion is preferably less than $4.0 \times 10^{-6}/°$ C.

In one aspect, the invention provides a temperature controlled chuck for a test apparatus for testing electronic devices, the chuck comprising:

a support plate having a device-contacting upper surface;
a base plate mounted below the support plate;
means for connecting the base plate to a test apparatus;
a connector having a low thermal expansion coefficient and comprising a set of pillars interconnecting the base plate and the support plate to provide a rigid structure; and
a heat transfer means mounted between the support plate and the base plate; and
a resilient mounting means supporting the heat transfer means in spaced-apart relationship with the base plate for accommodating expansion of the heat transfer means internally within the rigid structure.

In another aspect, the invention provides a temperature controlled chuck for a test apparatus for testing electronic devices, the chuck comprising:

a support plate having a device-contacting upper surface;
a base plate mounted below the support plate;
means for connecting the base plate to a test apparatus;
a connector having a low thermal expansion coefficient interconnecting the base plate and the support plate to provide a rigid structure;
a heat transfer means mounted between the base plate and the support plate; and
mounting means for the heat transfer means, said mounting means comprising a deformable part of the base plate supporting the heat transfer means whereby the deformable part distorts locally upon thermal expansion of the heat transfer means without causing distortion of the rigid structure.

In a further aspect, the invention provides a temperature controlled chuck for a test apparatus for testing electronic devices, the chuck comprising:

a support plate having a device-contacting upper surface;
a base plate mounted below the support plate;
means for connecting the base plate to a test apparatus;
a connector having a low thermal expansion coefficient interconnecting the base plate and the support plate to provide a rigid structure;
a heat transfer means mounted between the base plate and the support plate; and
mounting means for the heat transfer means, said mounting means comprising a resilient part of the heat transfer means for accommodating, by compression, expansion of other parts of the heat transfer means internally within the rigid structure.

According to a further aspect, the invention provides a temperature controlled chuck for a test apparatus for testing electronic devices, the chuck comprising:

a support plate having a device-contacting upper surface;

a base plate mounted below the support plate;

means for connecting the base plate to a test apparatus;

a connector having a low thermal expansion coefficient interconnecting the base plate and the support plate to provide a rigid structure of the support plate, the connector, and the base plate, a heat transfer means mounted between the support plate and the base plate;

mounting means for the heat transfer means comprising means for accommodating expansion of the heat transfer means internally within the rigid structure, and wherein the mounting means and the connector have a high electrical impedance, in excess of $10^{12}$ Ohms.

In another aspect, the invention provides a test apparatus comprising a control unit for controlling the heat transfer means, and an inspection station for supporting the temperature controlled chuck and probes for inspecting devices under test.

DESCRIPTION OF THE INVENTION

BRIEF DESCRIPTION OF THE DRAWINGS

The invention will be more clearly understood from the following description of some embodiments thereof, given by way of example only with reference to the accompanying drawings in which.

DETAILED DESCRIPTION OF THE EMBODIMENTS

Figure 1:
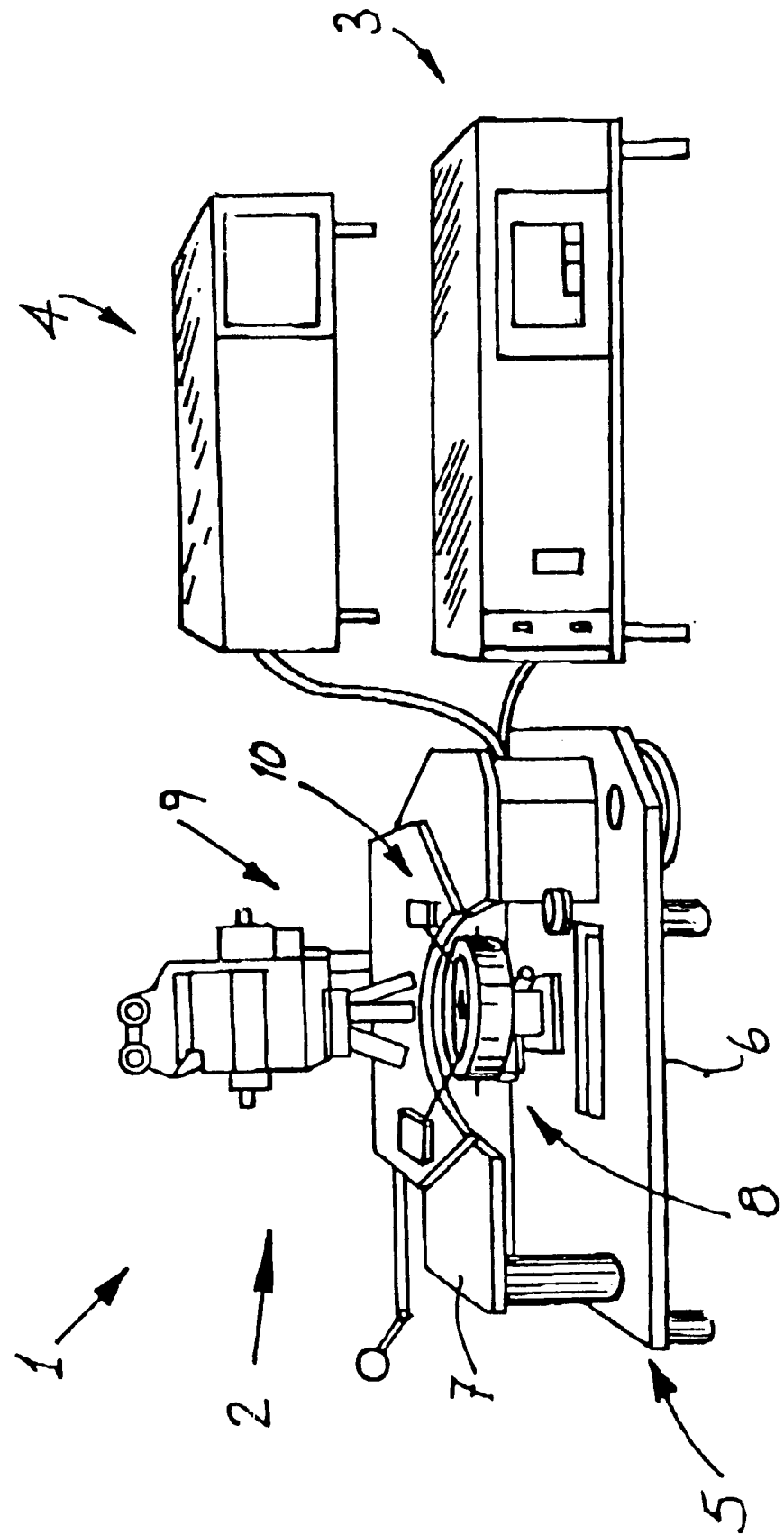
FIG. 1 is a perspective view showing a test apparatus of the invention.

Referring to the drawings, and initially to FIG. 1, there is shown a test apparatus of the invention indicated generally by the numeral 1. The apparatus 1 comprises a test station 2, an electronic controller 3 and a cooling system 4.

The inspection station 2 comprises a frame 5 having a lower table 6 and an upper table 7. The lower table 6 supports a temperature controlled chuck 8 in a manner whereby it causes it to rotate and also to move in a translational manner. The upper table 7 supports various microscopes 9 and probes 10 for inspection of a device under test when mounted on the chuck 8. The apparatus 1 will typically be used for testing of semiconductor wafers. The electronic controller 3 controls heating of a heat transfer means within the chuck 8. The cooling system 4 provides coolant to a heat transfer means within the chuck 8.

The chuck 8 supports the device under test by way of a vacuum, and directly heats or cools the device by temperature conduction through a device support plate of the chuck 8. The apparatus may include an enclosure for the device under test and the chuck for the purposes of ensuring that there is no air-borne contamination of the device under test, or condensation at low temperatures. An important aspect of the invention is the fact that there is excellent mechanical stability of the chuck 8 across the temperature range of operation so that the device under test remains in much the same absolute position, thus considerably reducing or eliminating the requirement for re-positioning the probes and adjusting the microscopes. Another important aspect is the fact that the device under test is electrically isolated, and therefore earth leakage does not occur.

Figure 2:
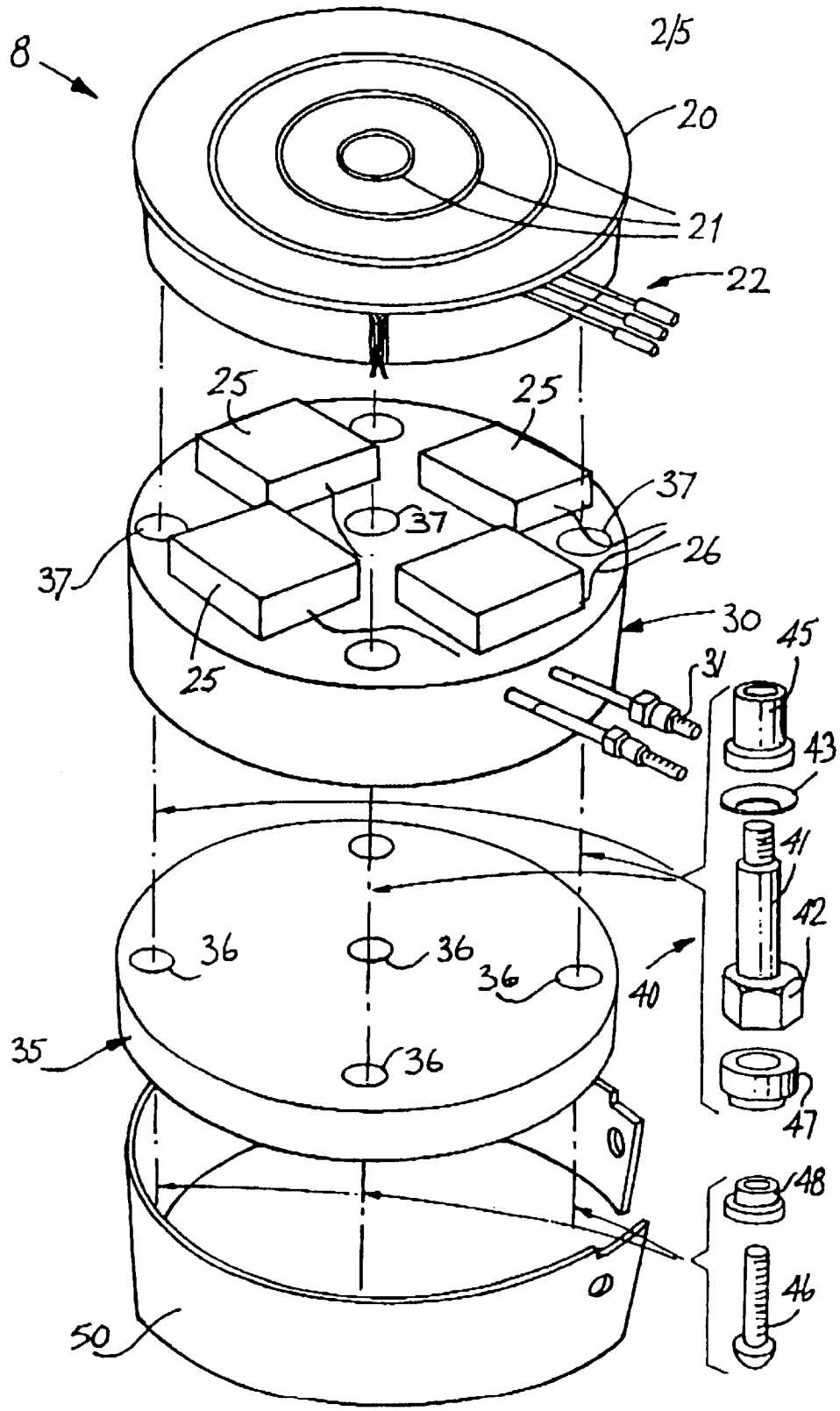
FIG. 2 is an exploded perspective view showing assembly of a temperature controlled chuck of the apparatus.
Figure 3:
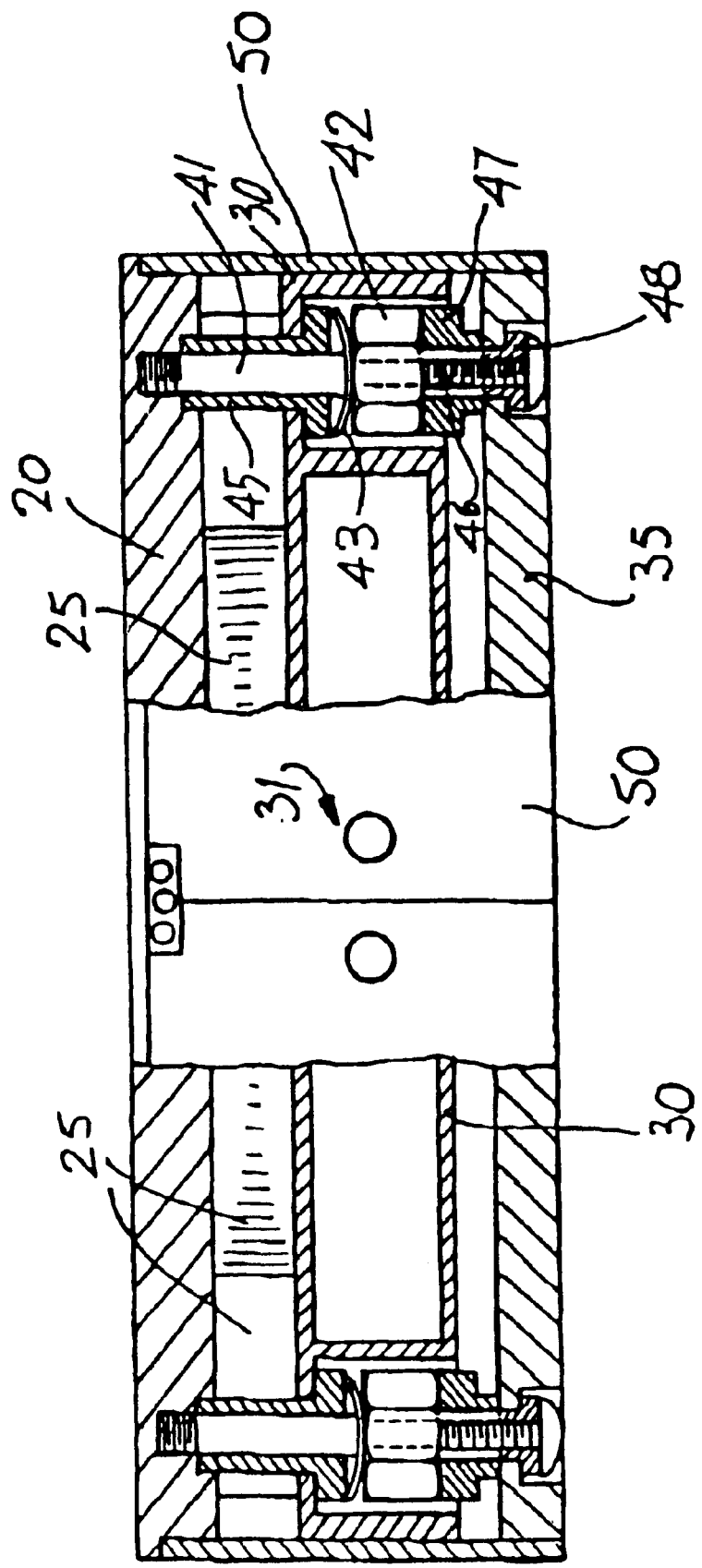
FIG. 3 is a detailed cross-sectional view of the chuck.

Referring now to FIGS. 2 and 3, the manner in which the above features are achieved are described in detail. The chuck 8 comprises a support plate 20 of aluminium material and having a flat upper surface for support of the device under test. The support plate 20 has three concentric circular grooves 21, each for independently applying suction to the device under test by virtue of suction lines 22. The support plate 20 is gold plated to ensure that there is little or no cross-contamination between the plate 20 and a device under test.

Mounted beneath the support plate 20, there is a heat transfer means, in this embodiment comprising a set of four Peltier or thermoelectric cells 25 and a heat sink 30. The Peltier cells 25 are capable of both heating and cooling the support plate 20, depending on the polarity of applied voltage. The cells 25 are mounted on the heat sink 30 via thermal grease. The cells 25 are each connected by leads 26 to the electronic controller 3. The heat sink 30 is a hollow chamber having a high internal surface area provided by internal pillars and contains coolant supplied by cooling tubes 31 from the cooling system 4. The purpose of the heat sink 30 is to thermally isolate the lower part of the chuck 8 while the cells 25 are heating, and to provide a relatively low temperature reference when the cells 25 are cooling.

The chuck 8 also comprises a base plate 35 of aluminium material and having a set of five through-holes 36 in registry with corresponding through-holes 37 in the heat sink 30. These holes are also in registry with sockets in the lower side of the support plate 20. The base plate 35 also comprises a set of lower apertures forming a means for connection to the inspection station.

The chuck 8 also comprises a set of five connectors, namely pillars 40 which rigidly connect the base plate 35 to the support plate 20 to provide a rigid structure. Each pillar 40 comprises a shank 41 which engages the base plate 35 and the support plate 20. They also each comprise a spacer 42 in the form of a bolt head mounted above the base plate 35. A spring washer to provide resilience is mounted above the spacer 42, and this in turn supports a ceramic washer 45, upon which the heat sink 30 is mounted. These components form a mounting means for the heat sink 30. Each pillar 40 also comprises a lower fastening screw 46 which protrudes upwardly through the base plate 35 to engage within the shank 41. Direct contact of the pillar with the base plate 35 is avoided by use of ceramic washers 47 and 48. The shank 41 and the spacer 42 are of Invar™ material. This material has a low coefficient of thermal expansion which in this embodiment is $2.2\times10^{-6}/°$ C. It has an inflection point of 191° C., a Curie temperature of 279° C., and a melting point of 1427° C. The chemical composition of this material is as follows:

| Chemical Composition (% Weight) | | | | | |
| --- | --- | --- | --- | --- | --- |
| C | MN | SI | P | S | SE |
| 0.06 | 0.77 | 0.26 | 0.012 | 0.004 | 0.201 |
| NI + CO | CR | NI | MO | CO | Fe |
| 36.31 | 0.14 | 36.05 | L1$^+$ .01 | 0.26 | 25.923 |

In general, the pillars should have a thermal expansion coefficient of less than $4.0\times10^{-6}/°$ C. and the value is preferably less than $3.0\times10^{-6}/°$ C.

Finally, the chuck 8 comprises a polyimide protective shroud 50 which surrounds the side edges of the base plate 35, the heat sink 30, the cells 25 and the support plate 20.

As described above, the combination of the support plate 20, the pillars 40 and the base plate 35 provide a rigid mechanical structure mounted on supports of the inspection station. As shown in FIG. 3, there is a space between the heat sink 30 and the base plate 35. In addition, the heat sink 30 is resiliently mounted on the base plate 35 via the pillars 40. This resilient mounting urges the cells 25 against the underneath surface of the support plate 20 to provide for effective heat conduction. A layer of thermal grease is applied between the thermoelectric cells 25 and the support plate 20 and also between the modules 25 and the heatsink 30 so that there is effective heat transfer with accommodation of mutual thermal contraction and expansion.

In operation, a semiconductor wafer is placed on the support plate 20 and a vacuum is applied to the lines 22 so that the wafer is held in place by vacuum through the grooves 21. The probes 9 are then positioned as desired for both electronic and visual inspection of the device as its temperature is controlled through a wide range, for example $-65°$ C. to $+135°$ C. During heating, the appropriate voltage is applied to the cells 25 so that their top surfaces heat and there is heat conduction through the support plate to the wafer. While this is happening, coolant at a temperature in and around room temperature is supplied to the heat sink 30 so that the base plate 35 and parts of the inspection station underneath it are permanently isolated from this heat. This helps to ensure long term reliability of the apparatus and prevents thermal expansion of parts below the heat sink 30.

As the temperature is increased, the cells 25 and the heat sink 30 expand to some extent. The cells 25 will remain in contact with the support plate 20 by virtue of the pressure which is applied upwardly by the spring washers 43. Accordingly, any thermal expansion will be downwardly-directed within the space between the heat sink 30 and the base plate 35. Therefore, there will be no mechanical pressure applied by the heat transfer means to the support plate/pillars/base plate rigid structure. Further, because of their low coefficient of thermal expansion, the length of the pillars 40 changes very little and the structure is overall quite stable.

The heatsink 30 also removes heat from the cells 25 during cooling. During cooling of the wafer, the heat transfer means will contract to some extent, however, the cells 25 of the heat transfer means will remain in contact with the support plate 20 by virtue of the pressure applied by the spring washers 43.

Another important aspect of the invention is the fact that the chuck does not provide an earth leakage path to the device under test because the ceramic washers 45, 47, and 48 have a very high impedance, in this embodiment $10^{16}$ Ohms. Thus, because the only physical connection between the support plate 20 and the rest of the chuck 8 and indeed the inspection station 2 is via ceramic washers, the device under test is electrically isolated. In general, the impedance of the pillars should be at least $10^{12}$ Ohms.

Regarding the mechanical stability of the chuck, it has been found that there is an overall expansion in the vertical direction of less than 0.025 mm throughout the temperature range of $-65°$ C. to $+135°$ C. Because of this very small overall movement, probes and microscopes can be mounted in place for a much wider temperature range than has heretofore been possible. The new design significantly improves testing quality and reduces time over current designs which have thermal expansion in the region of 0.2 mm over the same temperature range.

Figure 4:
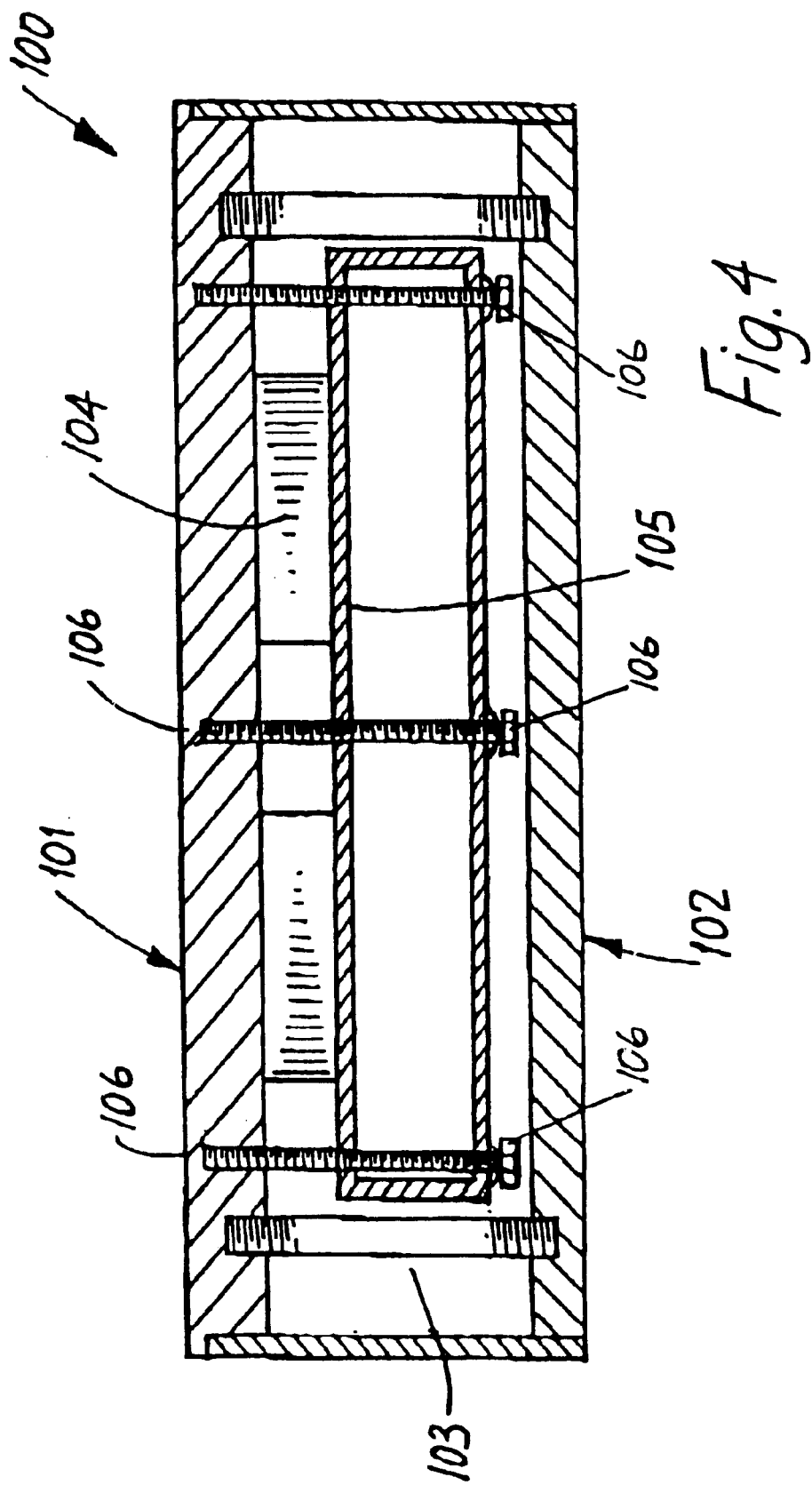
FIGS. 4 and 5 are diagrammatic cross-sectional views of alternative chucks of the invention.

It is not essential that the heat transfer means is mounted on the base plate, either directly or via pillars. The heat transfer means may alternatively be suspended from the support plate and such an arrangement is described in FIG. 4. In this embodiment, there is a chuck 100 having a support plate 101 and a base plate 102 which is connected to the support plate 101 by a set of pillars 103 having a low thermal expansion coefficient. A heat transfer means comprises a set of Peltier cells 104 and a heat sink 105. The heat transfer means is secured to the underneath of the support plate 101 by a mounting means, namely a set of fastening screws and spring washers 106. Again, there is a space between the heat transfer means and the base plate 102 to accommodate thermal expansion of the heat transfer means within the rigid structure. Further, there is little thermal expansion between the support and base plates by virtue of the pillars 103, which have a low thermal expansion coefficient. Because the heat transfer means is secured to the underneath of the support plate 101 by the fastening screws and spring washers 106, there will always be direct physical contact for heat conduction. The pillars 103 may be of a high impedance material, or alternatively may be connected to the base plate or the support plate by high-impedance fasteners. As for the chuck 8, there is always physical contact of the heat transfer means with the support plate, and thermal expansion is downwardly-directed within the space between the heat sink and the base plate.

The invention is not limited to the embodiments hereinbefore described, but may be varied in construction and detail. For example, the connector between the base and support plates need not necessarily comprise a set of pillars and may be in the form of an annular connector. The support plate need not necessarily be plated with gold—it may be of any suitable material plated or non-plated which prevents cross-contamination. It may, for example, be aluminium plated with platinum, or it may be of brass and not plated.

Figure 5:
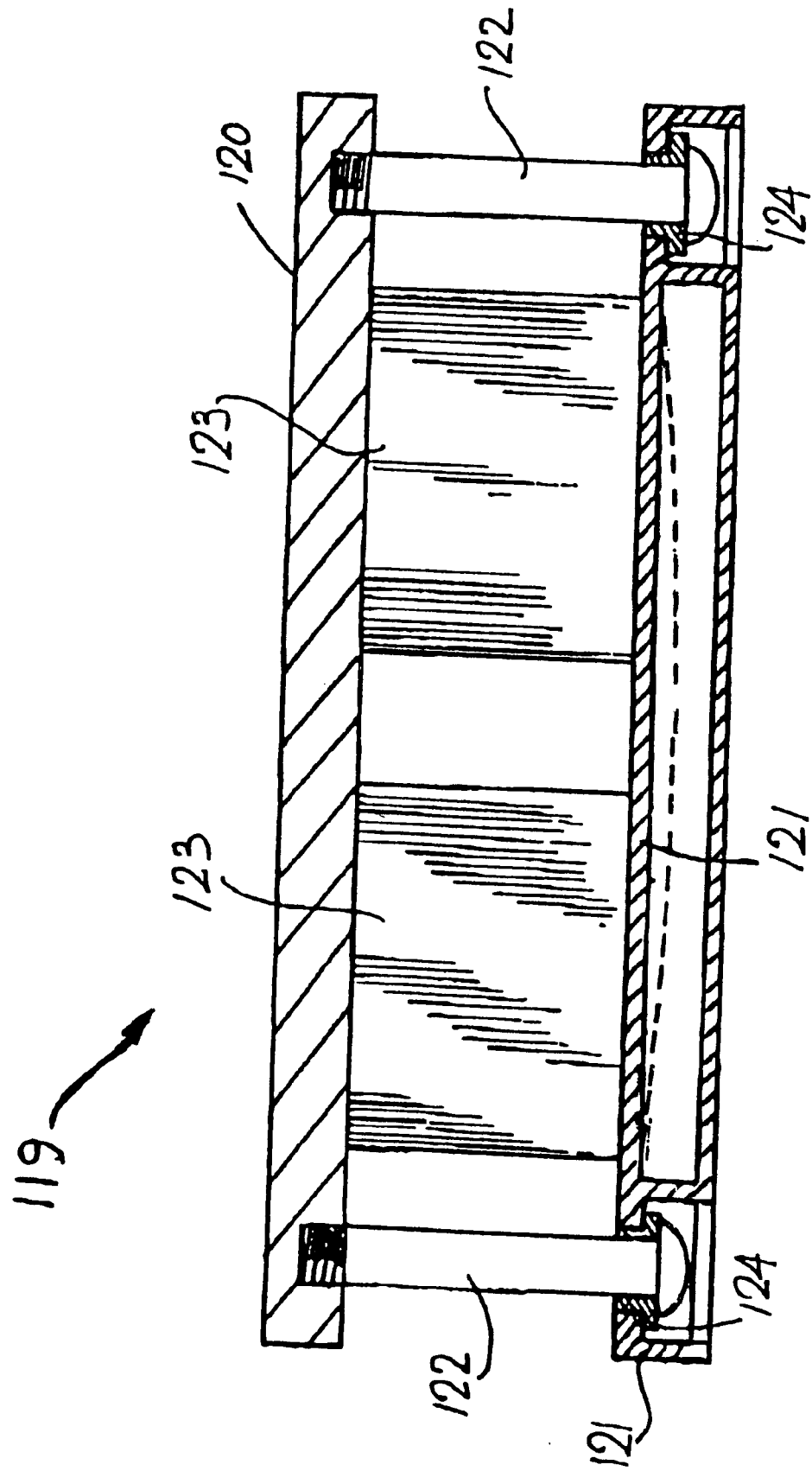

In the embodiments hereinbefore described, the mounting means for the heat transfer means internally accommodates expansion and prevents expansion/distortion of the rigid structure by providing a gap between the heat transfer means and the base plate. However, as shown in FIG. 5, such a gap may not exist. In this drawing, a chuck 119 has a support plate 120, a base plate 121 and Invar™ pillars 122 connecting them together. A heat transfer means comprising heating/cooling cells 123 and a base plate 121 are provided, the base plate 121 also acting as a heat sink directly connected to the cells 123. The pillars provide a high electrical impedance by way of ceramic washers 124. In this embodiment, the rigid structure comprises the support plate 120, the pillars 122, and the outer walls of the base plate 121, the latter having connecting means namely screw-holes for connection to the inspection station. The top central part of the base plate 121 is deformable and accommodates expansion of the cells 123 as shown by interrupted lines without affecting the rigid structure.

It is also envisaged that the heat transfer means may have a resilient part which transfers heat, but also accommodates expansion of other parts of the heat transfer means. In this embodiment, the base plate can be totally rigid—both internally and externally. Such a part of the heat transfer means may comprise a thermally conductive compressible foam. Such a foam may be mounted between thermoelectric cells and the support plate, or between the cells and the base plate. Again, the important point is that the heat transfer means does not cause expansion or distortion of the rigid structure and expansion is accommodated internally with very little effect on the absolute position of the device under test.

What is claimed is:

1. A temperature controlled chuck for a test apparatus for testing electronic devices, the chuck comprising:
   a support plate having a device-contacting upper surface;
   a base plate mounted below the support plate;
   means for connecting the base plate to a test apparatus;
   a connector having a low thermal expansion coefficient interconnecting the base plate and the support plate to provide a rigid structure of the support plate, the connector, and the base plate;
   heat transfer means mounted between the support plate and the base plate;
   cooling means between the base plate and the heat transfer means comprising a hollow body connected by cooling tubes to a cooling system; and
   mounting means for the heat transfer means comprising means for accommodating expansion of the heat transfer means internally within the rigid structure.

2. A temperature controlled chuck as claimed in claim 1, wherein the connector comprises a set of pillars secured to the base and support plates.

3. A temperature controlled chuck as claimed in claim 2, wherein the pillars are arranged symmetrically with respect to the support and base plates.

4. A temperature controlled chuck as claimed in claim 1, wherein the connector has a thermal expansion coefficient less than $3.0 \times 10^{-6}$ m/° C.

5. A temperature controlled chuck as claimed in claim 1, wherein the mounting means is resilient and supports the heat transfer means in spaced-apart relationship with the base plate.

6. A temperature controlled chuck as claimed in claim 5, wherein the mounting means mounts the heat transfer means on the connector, and the connector comprises a set of pillars rigidly secured to the base and support plates.

7. A temperature controlled chuck as claimed in claim 6, wherein the mounting means comprises spring washers to provide resilience to urge the heat transfer means against the support plate.

8. A temperature controlled chuck as claimed in claim 1, wherein the connector comprises a set of pillars and the mounting means and the connector have a high electrical impedance, in excess of $10^{12}$ Ohms.

9. A temperature controlled chuck as claimed in claim 8, wherein the mounting means comprises a set of electrically insulating washers around the pillars.

10. A temperature controlled chuck as claimed in claim 9, wherein the insulating washers are of ceramic material.

11. A temperature controlled chuck as claimed in claim 1, wherein the heat transfer means engages the support plate via thermal grease.

12. A temperature controlled chuck as claimed in claim 1, wherein the heat transfer means comprises heating and cooling means mounted above a heat sink and connected thereto by thermal grease.

13. A temperature controlled chuck as claimed in claim 12, wherein the heating and cooling means comprises a set of Peltier cells.

14. A temperature controlled chuck as claimed in claim 1, wherein the support plate is of aluminium material.

15. A temperature controlled chuck as claimed in claim 14, wherein the support plate is coated with an inert coating to prevent cross-contamination with a device under test.

16. A temperature controlled chuck as claimed in claim 1, wherein the base plate is of aluminium material.

17. A temperature controlled chuck as claimed in claim 1, wherein the mounting means comprises a deformable part of the base plate supporting the heat transfer means whereby the deformable part distorts locally upon thermal expansion of the heat transfer means without causing distortion of the rigid structure.

18. A temperature controlled chuck as claimed in claim 17, wherein said base plate comprises a heat sink also forming part of the heat transfer means.

19. A temperature controlled chuck as claimed in claim 1, wherein the mounting means comprises a resilient part of the heat transfer means accommodating by compression, expansion of other parts of the heat transfer means.

20. A test apparatus comprising a temperature controlled chuck as claimed in claim 1, a control unit for controlling the heat transfer means, and an inspection station for supporting the temperature controlled chuck and supporting probes for inspecting devices under test.

21. A temperature controlled chuck for a test apparatus for testing electronic devices, the chuck comprising:
   a support plate having a device-contacting upper surface;
   a base plate mounted below the support plate;
   means for connecting the base plate to a test apparatus;
   a connector having a low thermal expansion coefficient interconnecting the base plate and the support plate to provide a rigid structure;
   heat transfer means mounted between the base plate and the support plate;
   cooling means between the base plate and the heat transfer means comprising a hollow body connected by cooling tubes to a cooling system; and
   mounting means for the heat transfer means, said mounting means comprising a deformable part of the base plate supporting the heat transfer means whereby the deformable part distorts locally upon thermal expansion of the heat transfer means without causing distortion of the rigid structure.

22. A temperature controlled chuck as claimed in claim 21, wherein the base plate comprises a heat sink for the heat transfer means.

23. A temperature controlled chuck for a test apparatus for testing electronic devices, the chuck comprising:
   a support plate having a device-contacting upper surface;
   a base plate mounted below the support plate;
   means for connecting the base plate to a test apparatus;
   a connector having a low thermal expansion coefficient interconnecting the base plate and the support plate to provide a rigid structure;
   heat transfer means mounted between the base plate and the support plate;
   cooling means between the base plate and the heat transfer means comprising a hollow body connected by cooling tubes to a cooling system; and
   mounting means for the heat transfer means, said mounting means comprising a resilient part of the heat transfer means for accommodating, by compression, expansion of other parts of the heat transfer means internally within the rigid structure.

24. A temperature controlled chuck for a test apparatus for testing electronic devices, the chuck comprising:
   a support plate having a device-contacting upper surface;
   a base plate mounted below the support plate;
   means for connecting the base plate to a test apparatus;
   a connector having a low thermal expansion coefficient interconnecting the base plate and the support plate to provide a rigid structure of the support plate, the connector, and at least part of the base plate;

heat transfer means mounted between the support plate and the base plate;

cooling means between the base plate and the heat transfer means comprising a hollow body connected by cooling tubes to a cooling system; and mounting means for the heat transfer means comprising means for accommodating expansion of the heat transfer means internally within the rigid structure, and wherein the mounting means and the connector have a high electrical impedance, in excess of $10^{12}$ Ohms.

25. A temperature controlled chuck for a test apparatus for testing electronic devices, the chuck comprising:

a support plate having a device-contacting upper surface, a base plate mounted below the support plate;

means for connecting the base plate to a test apparatus;

a connector having a low thermal expansion coefficient and comprising a set of pillars interconnecting the base plate and the support plate to provide a rigid structure;

heat transfer means mounted between the support plate and the base plate;

cooling means between the base plate and the heat transfer means comprising a hollow body connected by cooling tubes to a cooling system; and a resilient mounting means supporting the heat transfer means in spaced-apart relationship with the base plate for accommodating expansion of the heat transfer means internally within the rigid structure.

* * * * *